United States Patent [19]

Kim

[11] Patent Number: 5,608,553
[45] Date of Patent: Mar. 4, 1997

[54] BACK LIGHT FOR A LIQUID CRYSTAL DISPLAY

[75] Inventor: Kyung-sik Kim, Pusan, Rep. of Korea

[73] Assignee: Samsung Display Devices Co., Ltd., Kyungki-do, Rep. of Korea

[21] Appl. No.: 635,649

[22] Filed: Apr. 22, 1996

[30] Foreign Application Priority Data

Jul. 24, 1995 [KR] Rep. of Korea .................. 93-18292

[51] Int. Cl.⁶ .............. G02F 1/1335; H01J 1/62
[52] U.S. Cl. .............. 349/61; 362/800; 313/512; 349/62
[58] Field of Search .................. 359/45, 49; 315/169.3; 362/800; 313/512

[56] References Cited

U.S. PATENT DOCUMENTS

| | | | |
|---|---|---|---|
| 4,573,766 | 3/1986 | Bournay, Jr. et al. | 359/48 |
| 4,939,426 | 7/1991 | Menard et al. | 362/800 |
| 5,167,556 | 12/1992 | Stein | 313/512 |
| 5,283,425 | 2/1994 | Imamura | 257/208.1 |
| 5,289,082 | 2/1994 | Komoto et al. | 313/512 |
| 5,298,768 | 3/1994 | Okazaki et al. | 257/81 |
| 5,404,277 | 4/1995 | Linblad | 359/49 |
| 5,469,019 | 11/1995 | Mori | 313/512 |

*Primary Examiner*—Anita Pellman Gross
*Assistant Examiner*—Toan Ton
*Attorney, Agent, or Firm*—Christie, Parker & Hale, LLP

[57] ABSTRACT

A back light for a liquid crystal display (LCD) includes a mold part. A first lead frame is installed on the inside of the mold part. In the first lead frame, the light emitting diodes are uniformly spaced apart from one another and each light emitting diode includes a chip. A first electrode is formed on one side of the chip and attached to the first lead frame. A second electrode is divided into two parts and formed on the other side of the chip. A plurality of conducting layers are respectively disposed between the light emitting diodes and each conducting layer is attached to the first lead frame. A plurality of connecting members connect each second electrode with each adjacent conducting layer. A second lead frame is installed on the inside of the mold part to be adjacent to the first lead frame. The second lead frame is connected to the adjacent second electrode by one of the connecting members.

1 Claim, 2 Drawing Sheets

BACK LIGHT FOR A LIQUID CRYSTAL DISPLAY

BACKGROUND

This invention relates to a back light for a liquid crystal display (LCD).

In general, LCD is composed of a liquid crystal display element into which a liquid crystal having a quality of dielectric anisotropy is injected, and a light emitting means which projects a light from the outside of the liquid crystal display element.

Therefore, the above described LCD displays a letter or a number, those being designated, or other random pictures on the screen, using the quality of the light reflection of the liquid crystal differentiating in accordance with the change of the voltage applied from the outside.

Also, mini LCD which is used in articles like hand phones uses a back light retaining a number of light emitting diodes as a light emitting means, and the diodes are attached to lead frames and respectively installed in a mold part.

In such a case, according to the characteristics of the back light, the light emitting diodes are installed in the mold part in series or in a parallel form.

FIG. 3 illustrates the installation of the light emitting diodes in a parallel form. As shown in the drawing, the back light for LCD includes a mold part 1. A first lead frame 3 is installed in the mold part 1 and connected to a plus electrode of a power source. A plurality of light emitting diodes 5 are installed on the first lead frame 3 and each light emitting diode includes a chip 50. An anode electrode is arranged in the lower part of the chip and attached to the light emitting diode.

The back light further includes a second frame 7. The second frame 7 is installed in the mold part 1 in the opposite direction of the first frame 3. Further, the second frame 7 is connected to a minus electrode of the power source. The back light also includes a bonding wire 9. A cathode electrode 52 is arranged on the upper part of the chip 50 and connected to the second frame 7 with the bonding wire 9.

The conventional back light for LCD in which the light emitting diodes 5, as described above, are installed in a parallel form, is used in LCD of low voltage level when LCD comes into operation.

However, the back light for LCD like the above, namely the back light retaining the light emitting diodes installed in a parallel form, has a problem. That is, it becomes difficult to structurize LCD with a thin film on account of the enlarged size of the back light. In the attached drawings, this size is followed by a small letter d.

When in the back light, the light emitting diodes respectively having a fixed size have been installed in a parallel form, the size of the back light becomes enlarged in accordance with the increase in the volume of the mold part occupied by the light emitting diodes as well as the first and second lead frames since, on the inside of the mold part, the second lead frame is positioned on the upper part of the first lead frame.

As described above, the size of the conventional back light is determined by the size of the light emitting diodes as well as the size of the lead frames.

SUMMARY

Accordingly, the present invention has been made in an effort to solve the above-described problem.

It is an object of the present invention to provide a back light for LCD with a thin film through preventing the enlargement of the back light size caused by the installation of the light emitting diodes retained in the back light.

The back light for LCD according to a preferred embodiment of the present invention includes a mold part. A first lead frame is installed on the inside of the mold part. In the first lead frame, a plurality of light emitting diodes are uniformly spaced apart from one another and each light emitting diode includes a chip. A first electrode is formed on one side of the chip and attached to the first lead frame. A second electrode is divided into two parts and formed on the the other side of the chip. A plurality of conducting layers are respectively disposed between the light emitting diodes and each conducting layer is attached to the first lead frame. A plurality of connecting members connect each second electrode with each adjacent conducting layer. A second lead frame is installed on the inside of the mold part to be adjacent to the first lead frame and connected to the second electrode by one of the connecting members.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DESCRIPTION

A preferred embodiment of the present invention will now be described in detail with reference to the accompanying drawings.

Figure 1:
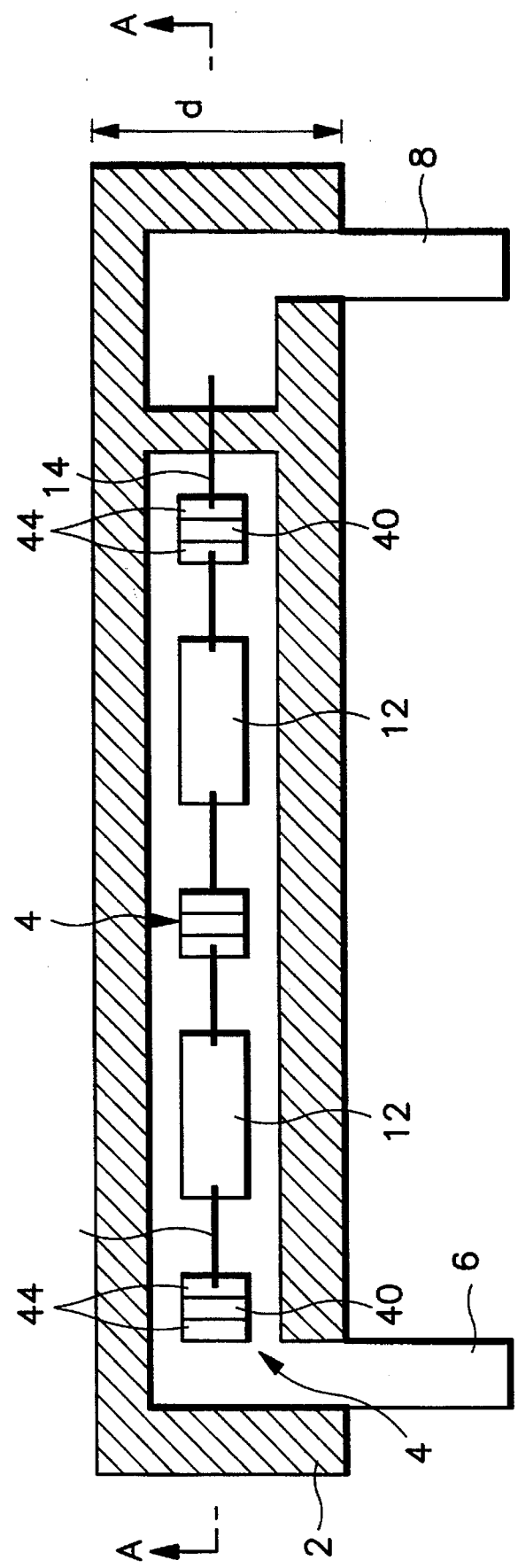
FIG. 1 is a cross-sectional view illustrating an installation of light emitting diodes retained in a back light for LCD according to a preferred embodiment of the present invention.
Figure 2:
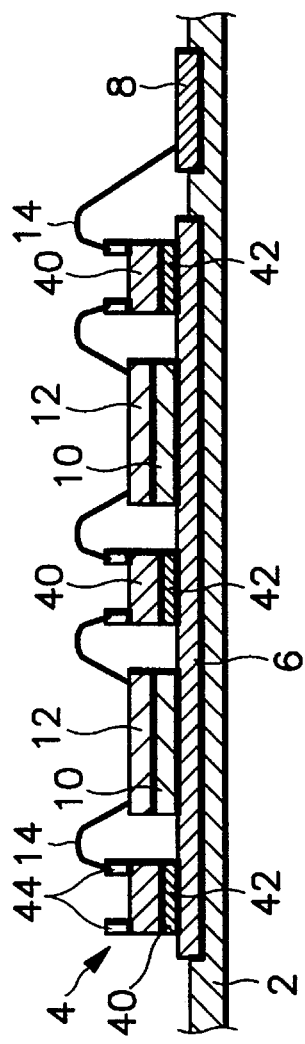
FIG. 2 is a cross-sectional view of the line A—A shown in FIG. 1 and the figure number 2 indicates a mold part retained in the back light.
Figure 3:
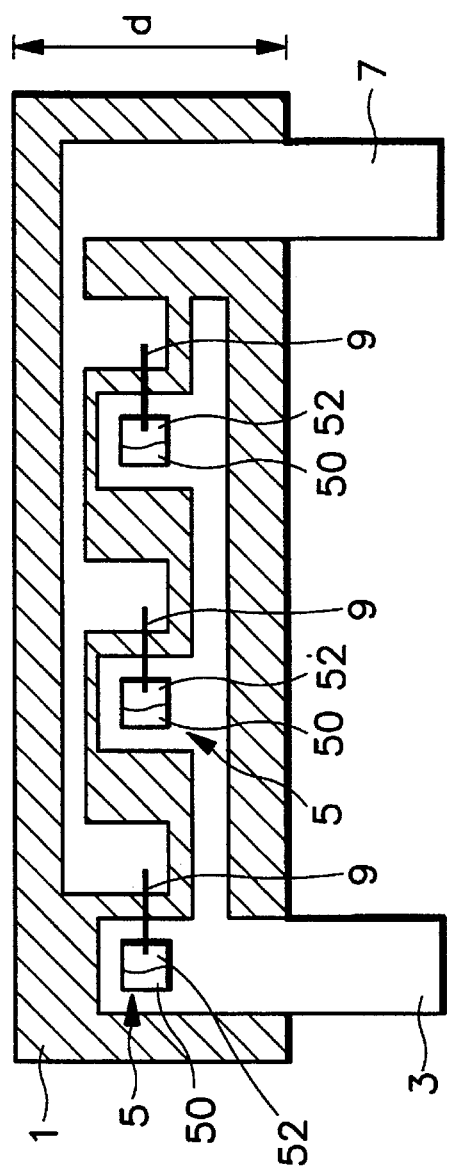
FIG. 3 is a view illustrating the conventional installation of the light emitting diodes in a parallel form.

As shown in FIGS. 1 and 2, a mold part 2 in which light emitting diodes 4 are installed, is provided in the inventive back light for LCD.

As described above, the light emitting diodes 4 are installed in series or in a parallel form with a conventional size, but here only the light emitting diodes installed in a parallel form will be described.

First, the light emitting diodes 4 as well as a first lead frame 6 and a second lead frame 8 are installed on the inside of the mold part 2.

In the perferred embodiment of the present invention, while the first lead frame 6 is connected to a plus electrode of the power source, the second lead frame 8 is connected to a minus electrode of the power source.

In the preferred embodiment of the present invention, three light emitting diodes 4 are attached to the first lead frame 6 and uniformly spaced apart from one another.

Each light emitting diode 4 includes a chip 40 and a first electrode 42 (See FIG. 2). The first electrode 42 is an anode electrode and formed in the lower part of the chip 40, and further attached to the first lead frame 6.

Further, conducting layers 12 which are attached to the first lead frame 6 by an attaching part 10 using bonding materials like an adhesive, are disposed between the light emitting diodes 4. Each conducting layer 12 is connected to a second electrode 44 which is a cathode electrode and divided into two parts, and further formed on the upper part of the chip 40 of the light emitting diode 4.

As shown in the attached drawings, these connections are performed by connecting each conducting layer 12 with each second electrode 44 by connecting members 14.

The second lead frame 8 which is installed at a predetermined distance from and parallel to the first lead frame 6, is also connected to the second electrode 44 using the connecting member 14.

That is, as described above, the back light for LCD includes the light emitting diodes 4 which are installed in a parallel form on the inside of the mold part 2, the fist lead frame 6 connected with the plus electrode of the power source, the first electrode 42 which is the anode electrode and connected to the first lead frame 6, the second lead frame 8 connected with the minus electrode of the power source, and the second electrode 44 which is the cathode electrode and connected to the second lead frame 8.

In this type of installation of the light emitting diodes 4, the areas of the lead frames on the inside of the mold part become decreased because the first lead frame 6 and the second lead frame 8 are installed in a parallel form, and thus the total size of the lead frames and the mold part, namely the size d of the back light can be reduced.

As described above, the purpose of the present invention is to provide a back light for LCD in which it is possible to make the total size of the back light smaller than conventional ones while the back light yet retains the light emitting diodes installed by the conventional way.

While this invention has been described in connection with what is presently considered to be the most practical and preferred embodiments, it is to be understood that the invention is not limited to the disclosed embodiment, but, on the contrary, it is intended to cover various modifications and equivalent arrangements included within the spirit and scope of the appended claims.

What is claimed is:

1. A back light for a liquid crystal display (LCD) comprising:

a mold part;

a first lead frame which is installed on the inside of the mold part;

a plurality of light emitting diodes which are uniformly spaced apart from one another in the first lead frame, each light emitting diode including a chip;

a first electrode which is formed on one side of the chip and attached to the first lead frame, and a second electrode which is divided into two parts and formed on the other side of the chip;

a plurality of conducting layers which are respectively disposed between the light emitting diodes, each conducting layer being attached to the first lead frame;

a plurality of connecting members for connecting each second electrode with each adjacent conducting layer; and a second lead frame which is installed on the inside of the mold part to be adjacent to the first lead frame and connected to the adjacent second electrode by one of the connecting members.

\* \* \* \* \*